Nov. 2, 1965 J. P. BARRET 3,215,953

AMPLITUDE MODULATOR

Filed Feb. 8, 1961

3 Sheets-Sheet 1

INVENTOR

JEAN PIERRE BARRET

BY Toulmin & Toulmin

ATTORNEYS

INVENTOR
JEAN PIERRE BARRET
BY Toulmin & Toulmin
ATTORNEYS

Nov. 2, 1965 J. P. BARRET 3,215,953

AMPLITUDE MODULATOR

Filed Feb. 8, 1961 3 Sheets-Sheet 3

INVENTOR
JEAN PIERRE BARRET

BY Toulmin & Toulmin
ATTORNEY 3,215,953

AMPLITUDE MODULATOR

Jean Pierre Barret, Marly-le-Roi, France, assignor to Institut Francais du Petrole, des Carburants et Lubrifiants, Rueil-Malmaison, Seine-et-Oise, France Filed Feb. 8, 1961, Ser. No. 87,828
Claims priority, application France, Feb. 11, 1960, 818,401
17 Claims. (Cl. 332—44)

The present invention relates to an improved amplitude modulator, more particularly to an amplitude modulator of very high sensitivity and stability irrespective of the temperature variations whereby such a modulated signal is obtained that a very wide range of amplification gain is applicable thereto by means of a high frequency amplifier provided with transistors. Due to its high sensitivity, the modulator according to this invention renders possible a subsequent amplification of low frequency signals even if they are very weak in amplitude.

A direct amplification of very weak signals of very low frequencies by amplifiers provided with transistors cannot be obtained with high amplification gains because of excessive noise resulting from the use of the transistors within the low frequencies range concerned and of difficulties encountered in attempts to reduce the cut-off frequency of the amplifier.

Up to the present time, such low frequency signals cannot be satisfactorily amplified after modulation thereof, because of failure to eliminate the carrier frequency. This failure is mainly due to the instability under varying temperatures of the semi-conductors used in the modulating circuits, so that elimination of the carrier frequency could only be achieved under particular temperature conditions.

In addition, good amplification results cannot be obtained in the range of frequencies of the order of 1 to 500 cycles per second, after mechanical modulation of the signal, since such mechanical modulation does not provide practical frequencies higher than 400 cycles per second. If it is considered that about 4 high frequency waves are required for modulating one wave of the low frequency signal, such mechanical modulation is not applicable to signals having a low frequency which is higher than 100 cycles per second.

Furthermore, even under the operating conditions with mechanical modulation (i.e. where signals to be modulated have a frequency lower than 100 c.p.s.) the subsequent amplification of modulated signals, by means of circuits provided with transistors, remains objectionable since the corresponding carrier frequency is within that range of frequencies at which an excessive noise produced by the transistors is to be observed (range of the frequencies lower than about 1,000 c.p.s.).

Finally, the use of a high frequency modulator comprising a diode ring does not provide for a satisfactory elimination of the residual carrier frequency within the temperature range of from −20° C. to +60° C. This results in a reduced capability of amplification without distortion of the modulated signal, since the ratio of the residual carrier frequency to the modulated low frequency input signal may be too high for providing a sufficient amplification of the latter without saturation of the amplifier by said residual carrier.

It is therefore the main object of this invention to provide for modulation of low frequency signals by means of a carrier frequency under such conditions that the modulated signal is substantially unaffected by temperature variations.

It is an additional object of this invention to overcome the difficulties encountered in amplifying low frequency signals.

It is another object of this invention to provide for a very wide range of possible amplification gain of modulated signals by means of amplifying circuits comprising transistors.

It is still another object of this invention to provide for modulation of low frequency signals by means of a carrier frequency which is substantially higher than that at which an excessive noise is produced by the use of transistors in a subsequent amplifying stage.

It is yet another object of this invention to provide for modulation of very weak signals of low frequency under such conditions that a high amplification gain may be applied thereto in a subsequent amplifying stage without deformation of said signals.

It is a further object of this invention to provide for modulation of a low frequency signal while substantially completely eliminating the residual carrier frequency without the necessity for adapting the modulator for changes in the ambient temperature conditions, thereby substantially eliminating concomitantly the noise which may result from the use of non-linearly varying impedance elements regardless of the frequency of the signal to be modulated.

The modulator according to the present invention essentially comprises a high frequency fed bridge having two balanced diagonals each of which receives a low frequency signal divided by means of non-linearly varying impedance elements switched between said diagonals, further comprising means for combining the modulated signals simultaneously available on the two diagonals so as to balance the deformations of opposite signs resulting on each of said diagonals from the residual carrier frequencies, which residues could not be eliminated until now because they are dependent on varying temperature conditions and on the noise which may be produced by the non-linearly varying impedance elements used.

Such a balancing effect is achieved according to this invention by adding or averaging the signals available on the two diagonals, the weighting coefficient being so selected as to cancel the high frequency residues, of opposite signs, remaining on the two diagonals.

Various devices may be employed for carrying out such a weighted addition. Some typical arrangements are shown, by way of example, in the accompanying drawings.

These and other objects and advantages of this invention will be apparent upon reference to the accompanying description in conjunction with the following drawings, wherein:

FIGURE 1 is a schematic circuit diagram of one of a modulator according to this invention comprising transformers the secondary windings of which are in opposite sense to each other so as to obtain between their terminals a potential difference which is proportional to that of the input signal, the output modulated signal being picked up between the terminals of a potentiometer of the circuit connecting the terminals of said transformers;

Figure 1:
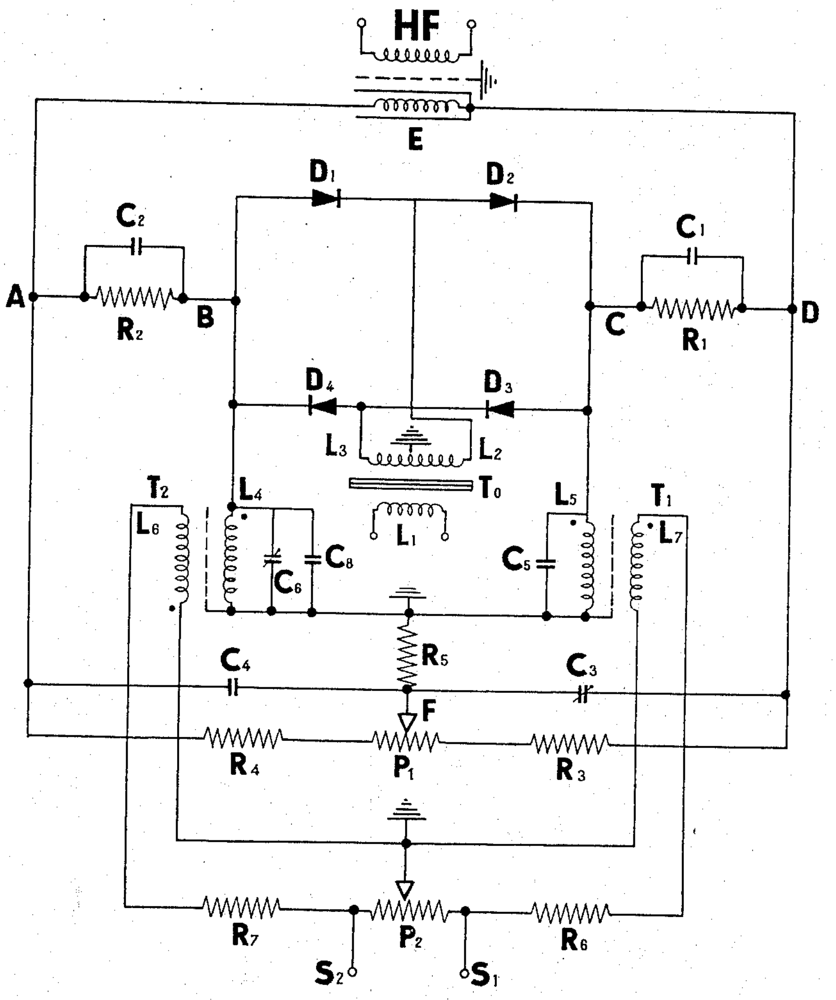
Figure 2:
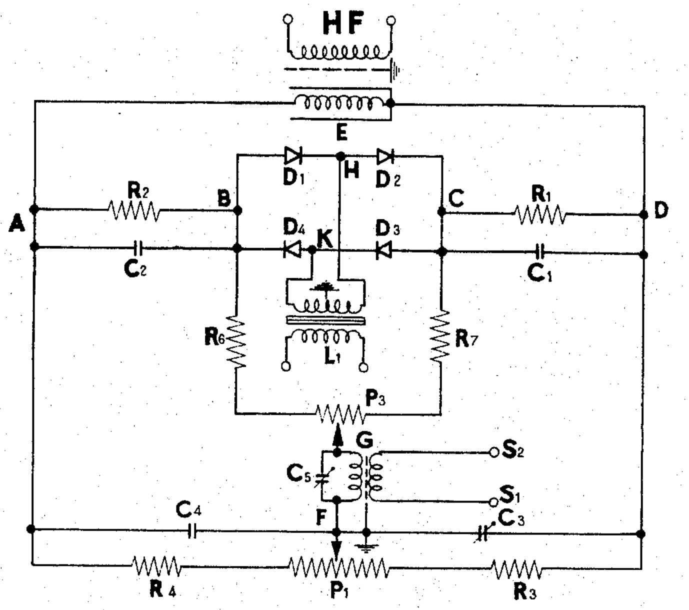
FIGURE 2 is a schematic circuit diagram of another arrangement without using transformers wherein the output modulated signal is picked up between a point at a reference potential and a circuit of the potential of the input signal, by means of a tuned circuit adapted to the modulating high frequency.
Figure 3:
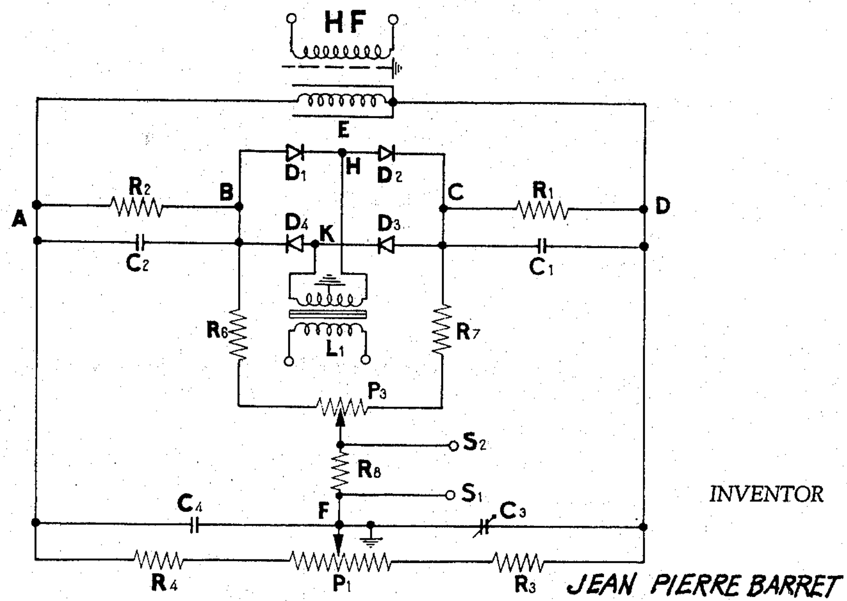
FIGURE 3 is a schematic circuit diagram of still another arrangement which is similar to that of FIGURE 2 except that the turned circuit is replaced by a resistor between the terminals of which is picked up the output modulated signal.
Figure 4:
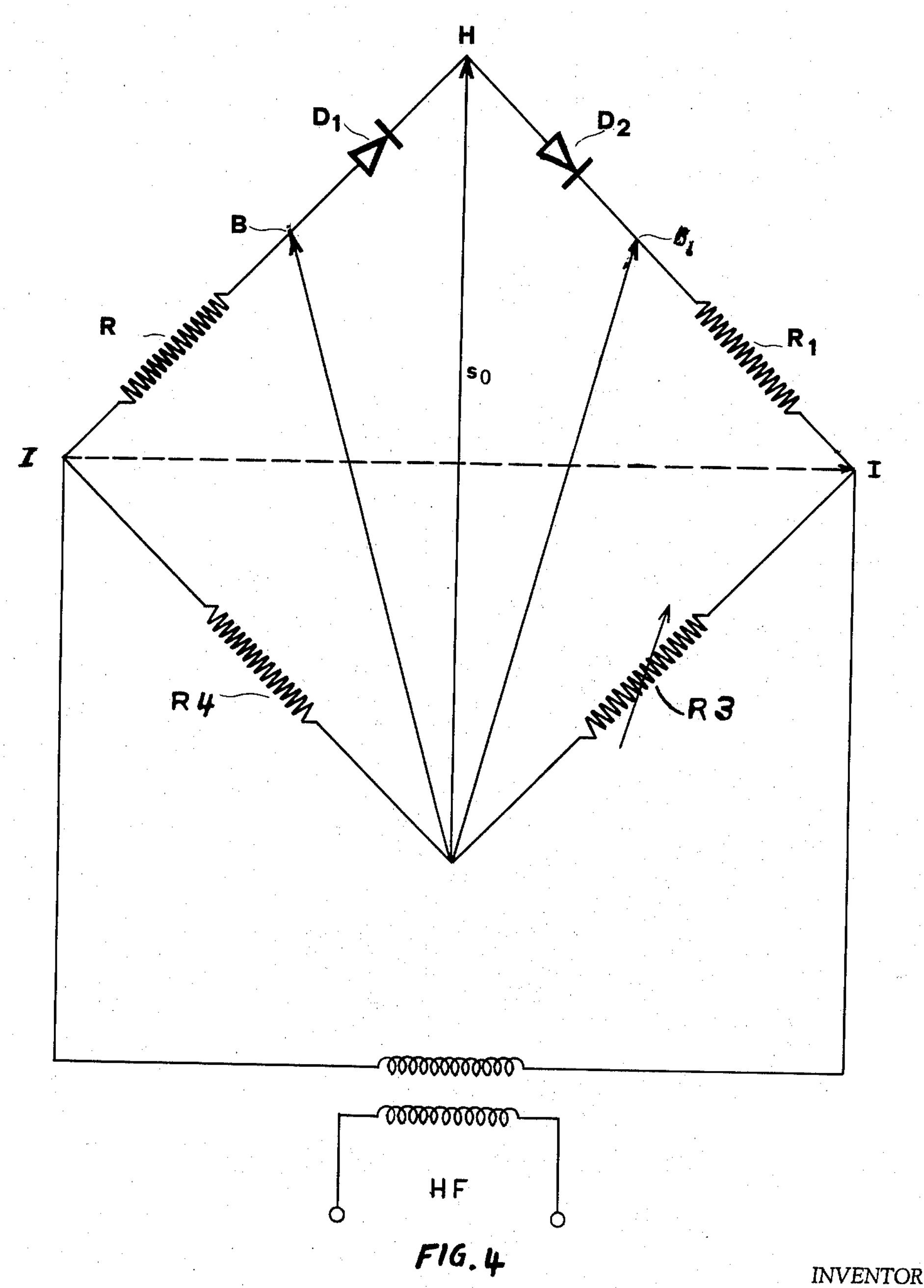
FIGURE 4 is a general diagrammatic bridge circuit illustrating the operation of the various embodiments shown in FIGURES 1 to 3.

Although it is preferred according to this invention to use an arrangement of the type shown in FIGURES 2 or 3, which is more simple than that according to FIGURE 1, the following description will refer more particularly to the lay-out shown in FIGURE 1, the main characteristics of which are also to be found in the two other arrangements shown in FIGURES 2 and 3, and to the general diagram of FIGURE 4.

According to this general diagram, the modulator of this invention comprises a four-arms bridge circuit FAHD between two opposite terminals of which (F and H) is introduced the input signal, $S_0$, and the two other terminals of which (A and D) are connected to a high frequency (HF) current source E.

Each of the two arms FA and FD comprises a linear impedance ($R_4$ and $R_3$ respectively) at least one of which ($R_3$ in FIGURE 4) is adjustable.

Each of the two other arms (AH and HD) comprises a linear impedance ($R_2$ and $R_1$ respectively) and a non-linear impedance ($D_1$ and $D_2$ respectively), the connecting line of the linear impedance and the non-linear impedance of each arm comprising a junction terminal (B and C respectively).

The output signal is the weighted sum of the two signals respectively obtained on diagonals $S_1$ and $S_2$, i.e. between F and B on the one hand and F and C on the other haand.

A first specific arrangement is diagrammatically represented in FIGURE 1. It comprises a high frequency energizing circuit AED receiving by means of the winding E an induced alternating current of high frequency HF. Between the points A and D of said circuit there is connected a first branched circuit comprising two linear impedance elements (i.e. complying with the ohmic law), consisting of resistor-capacitor couplings $R_1C_1$ and $R_2C_2$ having respective impedance values of $Z_1$ and $Z_2$ and at least a pair of diodes therebetween, and a second branched circuit comprising two resistors $R_3$ and $R_4$ coupled with the capacitors $C_3$ and $C_4$ respectively, said couplings having the respective impedance values $Z_3$ and $Z_3$, and an adjustable potentiometer $P_1$ by means of which is determined the potential difference between point A and D on the one hand and point F at a reference potential on the other hand.

The low-frequency signals are simultaneously modulated on diagonals BF and CF by the following manner:

The input signal to be modulated is supplied to the primary winding $L_1$ of a low-frequency transformer To provided with two secondary windings $L_2$ and $L_3$ so arranged that one of them provides a signal of the same polarity as that of the input signal and the other a signal of opposite polarity with respect to said reference potential. One of the secondary windings $L_2$ is connected between two non-linearly varying impedance elements of a first pair ($D_1$ and $D_2$) and the other between the two elements of a second pair ($D_3$ and $D_4$).

The non-linearly varying impedance elements may be selected from among the non-linearly varying resistances such as diodes, the non-linearly varying capacitances such as that of the "Varicap" type or the non-linearly varying inductances such as that of the type of saturable magnetic cores, so that they exhibit a low impedance when applying thereto a voltage of convenient polarity having the same value as that of the high frequency carrier. For sake of brevity said state of low impedance of said elements will be hereinafter designated by "state of conductivity."

The non-linearly varying impedance elements $D_3$ and $D_4$ are oriented in reverse direction to that of $D_1$ and $D_2$ so that at each half-cycle of the high frequency current only the elements of one pair ($D_1$ and $D_2$ or $D_3$ and $D_4$) are brought to the state of conductivity. The elements of the other pair are only brought to a state of conductivity by the next half-cycle of the high frequency current.

If, by way of example, elements $D_1$ and $D_2$ are brought to the state fo conductivity by the positive half-cycles of the carrier frequency current, there will correspond to each positive half-cycle, at points B and C as well as at the primary windings $L_4$ and $L_5$ of the high frequency transformers $T_1$ and $T_2$, potentials which are substantially equal to that of the winding $L_2$ of the low frequency transformer $T_0$. Similarly, at each negative half-cycle of the high frequency current, the potentials at the windings $L_4$ and $L_5$ will be substantially equal to that of the winding $L_3$ of the low frequency transformer $T_0$.

In order to secure a more complete equality between the potentials of the primary windings of the high frequency transformers and that of the secondary windings of the low frequency transformer, the non-linearly varying impedance elements must be selected so as to exhibit a minimum impedance when in the state of conductivity.

Accordingly, the low frequency voltage variations will be faithfully reproduced in the high frequency modulations obtained at the primary windings $L_4$ and $L_5$ of the high frequency transformers a variable capacitor $C_5$ being connected in parallel with $L_5$, a capacitor $C_8$ and a variable capacitor $C_6$ being connected in parallel with $L_4$. Said modulated signals are induced in the secondary windings $L_6$ and $L_7$ of said transformers and the weighted summation of the same is effected by means of a convenient device. Such a weighted summation provides for a balancing of the deformations which may result from the fact that the impedances $Z_1$ and $Z_2$ of the resistance-capacitance couplings $R_1C_1$ and $R_2C_2$ may rarely be selected of exactly the same value or may be voluntarily chosen of different values and, when high frequency transformers are used, as in the case of FIGURE 1, that the windings of said transformers $T_1$ and $T_2$ may be slightly different from each other.

This weighted summation is effected according to FIGURE 1 by means of the circuit comprising resistors $R_6$ and $R_7$ or more generally impedances $Z_6$ and $Z_7$ and a potentiometer $P_2$. This circuit is connected to the terminals of the secondary windings $L_6$ and $L_7$, one of which is so oriented as to provide a signal of inverse polarity from that of the input signal whereas the other provides a signal of the same polarity.

Consequently, the potential difference between the terminals of $L_6$ and $L_7$ is substantially twice that corresponding to the low frequency signal, (the number of turns of the windings $L_4$, $L_5$, $L_6$ and $L_7$ being assumed equal) whereas, to the contrary, the high frequency residues at $L_6$ and $L_7$ are of the opposite polarity.

Accordingly, the weighting of the signals obtained from $L_6$ and $L_7$ may be adjusted by means of the potentiometer $P_2$ so as to cancel the high frequency residues which are of opposite signs, whereas the low frequency signals will be converted to a signal proportional thereto obtained, for instance, between the terminals of the potentiometer $P_2$.

According to the diagram of FIGURE 2, wherein no provision is made for high frequency transformers, the weighted summation of the signals obtained on the two diagonals is achieved by the following manner:

The potential of the low frequency signal is obtained at each half-cycle of the high frequency current, at points B and C and in the circuit comprising resistors $R_6$ and $R_7$ and the potentiometer $P_3$ (FIGURE 2) which circuit is connected in parallel with that of each pair of non-linearly varying impedance elements ($D_1$ and $D_2$ or $D_3$ and $D_4$).

The weighted sum of the signal is obtained between a point at a reference potential (e.g. the ground) and a point on the potentiometer $P_3$ of said circuit which is so selected as to cancel or nullify by balancing the high frequency residues of opposite polarities which remain at points B and C, and received in a tuned circuit adapted to the high carrier frequency and comprising the primary winding of a transformer G and a tuning variable capacitor $C_5$ which may be adjusted so as to increase the impedance on the diagonal GF. The modulated signal is picked up between the terminals $S_1$ and $S_2$ of the secondary winding of the transformer G, after adjustment of the weighting coefficient by means of the potentiometer $P_3$.

The lay-out according to FIGURE 3 differs from the diagram of FIGURE 2 in that the tuned circuit is replaced by a resistor 8 between the terminals of which is obtained the output modulated signal.

This lay-out is particularly advantageous in the case where the low frequency signal is to be divided with high frequency rectangular waves. Such a lay-out provides thus for a wider band-pass of the modulator according to this invention.

The weighted summation of the modulated signals obtained on the two diagonals BF and CF, which is one essential characteristic of this invention, results in a considerable improvement in eliminating the high frequency carrier residues under such conditions that said elimination is still achieved whatever may be the ambient temperature. This result was unexpected in view of the well-known disturbance in the operating conditions of the non-linearly varying impedance elements resulting from temperature changes.

This unexpected result obtained according to this invention is hereinafter demonstrated with reference to the drawings by the following simplified calculation wherein $z$ represents the impedance of each pair of non-linearly varying impedance elements when in a state of conductivity, $x$ the proportion of $P_1$ constituting a part of the circuit CDF, $e$ the high frequency energy between the terminals of the secondary winding E and wherein $u_1$ and $u_2$ are respectively representing the potential differences attributable to the carrier frequency between the terminals of the diagonals, $u_1$ between C and F and $u_2$ between B and F.

This computation shows that there does exist a value of the weighting coefficient $k$ of these two potential differences $u_1$ and $u_2$ which, in association with a certain value of $x$, provides for the nullification of the output high frequency weighted residue $u_s$ as defined by the equation:

$$u_s = u_1 + ku_2 = 0$$

$Z_1$, $Z_2$, $Z_3$ and $Z_4$ designating the respective impedances of the resistor-capacitor couplings $R_1C_1$, $R_2C_2$, $R_3C_3$ and $R_4C_4$, the values of $u_1$ and $u_2$ are the following:

$$u_1 = \frac{Z_1}{Z_1+z+Z_2}e - \frac{Z_3+xP_1}{Z_3+P_1+Z_4}e$$

$$u_2 = \frac{Z_2}{Z_1+z+Z_2}e - \frac{Z_4+(1-x)P_1}{Z_4+P_1+Z_4}e$$

from which is deduced the value of $u_s$:

$$u_s = u_1 + ku_2 = e\left[\frac{Z_1-kZ_2}{Z_1+z+Z_2} - \frac{(Z_3+xP_1)-k[Z_4+(1-x)P_1]}{Z_3+P_1+Z_4}\right]$$

which value is nullified when the following relation is fulfilled:

$$\text{(I)}\quad (Z_1-kZ_2)(Z_3+P_1+Z_4) = (Z_1+z+Z_2)[Z_3+xP_1-k[Z_4+(1-x)P_1]$$

This relation expresses that $u_s$ is made independent from the value $e$ of the high frequency energy and remains therefore unchanged whatever may be the variations of $e$. However, according to the invention it is further required that said independence between $u_s$ and $e$ be maintained even when the value of the impedance $z$ is varied, which is the case when the non-linearly varying impedance elements are subjected to temperature changes.

This new condition implies the nullification of the coefficient of $z$:

$$Z_3+xP_1-k[Z_4+(1-x)P_1=0$$

from which is deduced the convenient value of $k$:

$$k = \frac{Z_3+xP_1}{Z_4+(1-x)P_1}$$

However, the Relation I must always be fulfilled with that zero value of the coefficient of $z$, which results in the equation:

$$(Z_1-kZ_2)(Z_3+P_1+Z_4) = 0$$

from which it is deduced:

$$k = \frac{Z_1}{Z_2}$$

Equalization of the two values of $k$ provides the relation:

$$\text{(II)}\quad \frac{Z_1}{Z_2} = \frac{Z_3+xP_1}{Z_4+(1-x)P_1}$$

from which is deduced the value of $x$:

$$x = \frac{Z_1Z_4 - Z_2Z_3 + P_1Z_1}{P_1(Z_1+Z_2)}$$

These values of $x$ and $k$ providing for the nullification of the high frequency residue at the output of the modulator are obtained by adjustment of the potentiometers $P_1$ and $P_2$ (FIGURE 1) or $P_1$ and $P_3$ (FIGURE 2).

In practice, the adjustment of $x$ and $k$ to the above mentioned values to provide for the elimination of the high frequency residues is carried out empirically by varying the adjustment of potentiometers $P_1$ and $P_2$ (FIGURE 1) or $P_1$ and $P_3$ (FIGURES 2 and 3) so that no high frequency residue is to be observed in the modulated signal obtained at the output terminals $S_1$ and $S_2$.

It is to be remarked that the value of $k$, which ensures the elimination of the high frequency residue being equal to $$\frac{Z_1}{Z_2}$$

must not be modified by temperature changes. Accordingly, the impedances $Z_1$ and $Z_2$ will be provided by capacitors, resistors or inductors having the same temperature coefficients, which coefficient will be preferably as low as possible.

However, the use of potentiometers is not necessary where provision is made for directly adjusting the values of impedances $Z_1$, $Z_2$, $Z_3$, $Z_4$, $Z_6$ and $Z_7$.

These adjustable impedances which may be capacitances or inductances as well as resistances may thus be given the exact values $Z'_1$, $Z'_2$, $Z'_3$, $Z'_4$, $Z'_6$ and $Z'_7$ providing for the nullification of the high frequency residue under varying temperature conditions.

In the case of the diagrams shown in FIGURES 2 and 3, said values $Z'_1$, $Z'_2$, $Z'_3$, $Z'_4$, $Z'_6$ and $Z'_7$ are related to each other according to the following equation:

$$\frac{Z'_1}{Z'_2} = \frac{Z'_3}{Z'_4} = \frac{Z'_7}{Z'_6} = k$$

the first equality of which may be readily deduced from Relation II above, wherein $P_1=0$, and the second from the relations:

$$\frac{u_1}{Z'_7} = \frac{-u_2}{Z'_6}$$

and $$k = \frac{-u_1}{u_2} = \frac{Z'_7}{Z'_6}$$

It must be observed that it is of particular advantage to replace in the diagrams of FIGURES 1–3 the resistances or couplings of resistances with capacitances by mere capacitances or inductances, of the adjustable type, since they do not produce noise and do not absorb energy from the signal and therefore provide for a better ratio of the output signal to the noise level.

Moreover, in view of avoiding any substantial weakening of the modulated signal obtained on the diagonals, which weakening might result from a too high voltage drop through the non-linearly varying impedance elements, it may be convenient to select the values of impedances $Z_1$, $Z_2$, $Z_3$ and $Z_4$ as high as possible, as compared with that of said elements when in a state of conductivity.

There is thus obtained between the terminals $S_1$ and $S_2$ of the modulator an output signal which is substantially free from high frequency residues whatever may be on one hand the impedances of the non-linearly varying impedance elements, when in a state of conductivity and variations of the same, and on the other hand, the voltage of the high frequency carrier.

Moreover, the weighted summation of the low frequency modulated signals obtained respectively on the two diagonals, according to this invention, provides for a considerable decrease of the noise produced by the non-linearly varying impedance elements. In actual fact said noise, corresponding to the passage of a parasitic current through the diagonals circuit, goes through said diagonals in reverse directions, which results, when carrying out the summation of the signals obtained on the two diagonals, in the addition of two currents of substantially the same absolute value but of opposite signs which are balancing one another.

It must be emphasized that, whereas the specific examples of arrangements of the modulator according to the invention shown in FIGURES 1, 2 and 3 comprise the use of two pairs of non-linearly varying impedance elements, similar results can be attained by a single pair of such elements, the low frequency signal being thus modulated only by the positive or the negative alternations of the high frequency. In such a case the use of a low frequency transformer becomes unnecessary and the low frequency signal may be directly applied between the two elements of said pair.

In addition to the aforementioned advantages of the modulator according to the invention and as the result of a substantially simultaneous complete elimination of the high frequency residues under varying temperature conditions and of the noise produced by the non-linearly varying impedance elements, there must be mentioned the considerable advantage of a very wide gain range applicable to the modulated signal without substantial deformation of the same, or correspondingly, the very wide range of acceptable amplitudes of the input signals to be modulated.

It will be understood that this invention is susceptible to modifications in order to adapt it to different usages and conditions and, accordingly, it is desired to comprehend such modifications within this invention as may fall within the scope of the appended claims.

What I claim is:

1. A temperature compensated amplitude modulator with a bridge circuit having four arms and correspondingly four terminals, the combination comprising: two bridge arms each comprising a linear impedance, at least one thereof being adjustable, and being joined at the first terminal, the respective other ends of the two arms constituting a second and a third terminal; means for applying a carrier frequency between said second and said third terminal; the two further bridge arms, respectively connected to said second and said third terminal and being interconnected so as to form the fourth bridge terminal, said further bridge arms each including linear impedance in connection with non-linear impedance having their non-linear impedances interconnected at said fourth terminal, said connection between linear and non-linear impedance on each further bridge arm defining respectively a fifth and a sixth terminal, means for applying a modulation signal between said first and said fourth terminal; means for deriving a first output signal from between said first and said fifth terminal; means for deriving a second output signal from between said first and said sixth terminal; and means for combining said two output signals to a common, balanced output signal.

2. A temperature compensated amplitude modulator comprising two linear impedances, at least one being adjustable, and being interconnected at the first common terminal, the respective other ends of said impedances constituting a second and a third terminal; a source of A.C. voltage connected to said second and said third terminal and supplying a carrier frequency thereto; two further linear impedances respectively connected to said second and said third terminal and defining with their other ends a fourth and a fifth terminal respectively; two interconnected non-linear impedances having a common end defining a sixth terminal and interconnecting said fourth and said fifth terminal; two further interconnected non-linear impedances having a common end defining a seventh terminal and interconnecting said fourth and said fifth terminal in such a manner that at a change of voltage amplitude between said fourth and said fifth terminal the first two non-linear impedances alter their impedance values in opposite direction to those of the further non-linear impedances; means for applying simultaneously oppositely directed modulation signals of the same absolute value between said first terminal and said sixth and seventh terminals respectively; means for deriving a first output signal from between said first and said fourth terminal; means deriving a second output signal from between said first and said fifth terminal; and means for combining said two output signals to a balanced common output signal.

3. A modulator as set forth in claim 2, said two means for deriving said first and said second output signals including adjustable linear impedances.

4. A modulator as set forth in claim 2, said two means for deriving said first and second output signals each including primary windings of respective transformers which primaries are joined at said first terminal; said output combining means including the secondary windings of said transformers connected in opposite orientation and resistive means including a potentiometer connected with its tap to said first terminal.

5. A modulator as set forth in claim 2, said last-mentioned three means including two impedances respectively connected to said fourth and fifth terminal and interconnected via a potentiometer, and means for deriving said balanced output signal from between the tap of said potentiometer and said first terminal.

6. A modulator as set forth in claim 5, said last-mentioned means being a resistor.

7. A modulator as set forth in claim 5, said last-mentioned means being a transformer.

8. An amplitude modulator according to claim 2, wherein the non-linearly varying impedances are selected form the group consisting of non-linearly varying capacitance elements of the Varicap type and non-linearly varying inductance elements of the type of saturable magnetic cores.

9. An amplitude modulator according to claim 2, wherein the non-linearly varying impedance elements are diodes.

10. An amplitude modulator according to claim 2, wherein the linear impedance elements are selected from the group consisting of resistors, capacitors and inductors.

11. An amplitude modulator according to claim 1, wherein the non-linearly varying impedances are selected from the group consisting of non-linearly varying capacitance elements of the Varicap type and non-linearly varying inductance elements of the type of saturable magnetic cores.

12. An amplitude modulator according to claim 1, wherein the non-linearly varying impedance elements are diodes.

13. An amplitude modulator according to claim 1, wherein the linear impedance elements are selected from the groups consisting of resistors, capacitors and inductors.

14. An amplitude modulator of high sensitivity and insensitive to temperature variations comprising two linear impedance elements in an energizing circuit connected to a high frequency current source, a first pair of non-linearly varying impedance elements oriented in one direction, a second pair of non-linearly varying impedance elements in parallel to said first pair of elements and oriented in a direction opposite to said one direction, said pairs of varying impedance elements connected between said linear impedance elements, means for applying a low frequency input signal which is to be modulated between the elements of said first and second pairs of elements, said input signal being represented by a potential difference with respect to a reference potential, two other linear impedance elements of the adjustable type connected to said energizing circuit for adjusting the potential difference between the respective potentials at the terminals between the high frequency current source and the pair of varying impedance elements and said reference potential, two high frequency transformers each having a primary and a secondary winding, said primary windings being connected to said terminals and said secondary windings being inversely oriented with respect to each other, electrical resistance means and a potentiometer connected to said secondary windings, the output signal being obtained between the terminals of said potentiometer and comprising the weighted average of the two modulated signals each available between one of the terminals of said pairs of elements and said reference potential.

15. An amplitude modulator of high sensivity and insensitive to temperature variations comprising two linear impedance elements in an energizing circuit connected to a high frequency current source, a first pair of non-linearly varying impedance elements oriented in one direction, a second pair of non-linearly varying impedance elements in parallel to said first pair of elements and oriented in a direction opposite to said one direction, said pairs of varying impedance elements connected between said linear impedance elements, a low frequency transformer having a primary winding which receives the signal to be modulated and two secondary windings oriented in reverse direction to each other to provide for signals of opposite polarities, said secondary windings being connected between the elements of said first and second pairs of elements, so as to supply said signals of opposite polarities in the form of a potential difference with respect to a reference potential, two other linear impedance elements of the adjustable type connected to said energizing circuit for adjusting the potential difference between the respective potentials at the terminals between the high frequency current source and the pairs of varying impedance elements and said reference potential, two high frequency transformers each having a primary and a secondary winding, said primary windings being connected to said terminals and said secondary windings being inversely oriented with respect to each other, electrical resistance means and a potentiometer connected to said secondary windings, the output signal being obtained between the terminals of said potentiometer and comprising the weighted average of the two modulated signals each available between one of the terminals of said pairs of elements and said reference potential.

16. An amplitude modulator of high sensitivity and insensitive to temperature variations comprising two linear impedance elements in an energizing circuit connected to a high frequency current source, a first pair of non-linearly varying impedance elements oriented in one direction, a second pair of non-linearly varying impedance elements in parallel to said first pair of elements and oriented in a direction opposite to said one direction, said pairs of varying impedance elements connected between said linear impedance elements, means for applying a low frequency input signal which is to be modulated between the elements of said first and second pairs of elements, said input signal being represented by a potential difference with respect to a reference potential, two other linear impedance elements of the adjustable type connected to said energizing circuit for adjusting the potential difference between the respective potentials at the terminals between the high frequency current source and the pair of varying impedance elements and said reference potential, a second pair of linear impedance elements of the adjustable type connected between said terminals of said pairs of non-linearly varying impedance elements, and a tuned circuit adapted to said high frequency and comprising parallelly connected variable capacitor and a transformer, said tuned circuit connected between said second pair of linear impedance elements and said reference potential, and an output circuit comprising the secondary winding of said transformer at the terminals of which the modulated output signal is picked up.

17. An amplitude modulator of high sensitivity and insensitive to temperature variations comprising a first pair of linear impedance elements in an energizing circuit connected to a high frequency current source, a first pair of non-linearly varying impedance elements oriented in one direction, a second pair of non-linearly varying impedance elements in parallel to said first pair of elements and oriented in a direction opposite to said one direction, said pairs of non-linearly varying impedance elements being connected between the linear impedance elements of said first pair, means for applying a low frequently input signal which is to be modulated between the elements of said first and second pairs of non-linearly varying impedance elements, said input signal being represented by a potential difference with respect to a reference potential, linear impedance elements of the adjustable type connected to said energizing circuit for adjusting the potential difference between the respective potentials at the common terminals of the high frequency current source and the pairs of non-linearly varying impedance elements and said reference potential, other of linear impedance elements of the adjustable type connected between said terminals of said pairs of non-linearly varying impedance elements, and an output circuit comprising a resistor connected between said last-mentioned of linear impedance elements and a point at said reference potential, there being terminals on said resistor for the output modulated signal.

References Cited by the Examiner

UNITED STATES PATENTS

| | | | |
|---|---|---|---|
| 2,695,988 | 11/54 | Gray | 332—44 |
| 2,820,949 | 1/58 | Hey | 332—47 |
| 2,985,840 | 5/61 | Theodore et al. | 332—44 |
| 3,034,075 | 5/62 | Sieber et al. | 332—47 |

ROY LAKE, *Primary Examiner.*

L. MILLER ANDRUS, ALFRED L. BRODY, *Examiners.*